United States Patent
Thompson et al.

(10) Patent No.: US 9,328,415 B2
(45) Date of Patent: May 3, 2016

(54) METHODS FOR THE DEPOSITION OF MANGANESE-CONTAINING FILMS USING DIAZABUTADIENE-BASED PRECURSORS

(71) Applicant: Applied Materials, Inc., Santa Clara, CA (US)

(72) Inventors: David Thompson, San Jose, CA (US); Jeffrey W. Anthis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 14/296,897

(22) Filed: Jun. 5, 2014

(65) Prior Publication Data

US 2014/0363575 A1    Dec. 11, 2014

Related U.S. Application Data

(60) Provisional application No. 61/831,748, filed on Jun. 6, 2013.

(51) Int. Cl.
| | |
|---|---|
| *C23C 16/18* | (2006.01) |
| *C23C 16/06* | (2006.01) |
| *C23C 16/455* | (2006.01) |
| *C23C 16/34* | (2006.01) |
| *H01L 21/285* | (2006.01) |
| *H01L 23/532* | (2006.01) |
| *H01L 21/768* | (2006.01) |

(52) U.S. Cl.
CPC .................. *C23C 16/18* (2013.01); *C23C 16/34* (2013.01); *C23C 16/45534* (2013.01); *C23C 16/45553* (2013.01); *H01L 21/28562* (2013.01); *H01L 21/76843* (2013.01); *H01L 23/53238* (2013.01); *H01L 2924/0002* (2013.01)

(58) Field of Classification Search
CPC ...... C23C 16/18; C23C 16/303; C23C 16/06; C23C 16/45534; C23C 16/45553
See application file for complete search history.

(56) References Cited

U.S. PATENT DOCUMENTS

| | | | |
|---|---|---|---|
| 5,186,718 A | 2/1993 | Tepman et al. | |
| 5,874,131 A | 2/1999 | Vaartstra et al. | |
| 6,020,511 A | 2/2000 | Vaartstra et al. | |
| 2012/0231164 A1* | 9/2012 | Thompson | C07F 13/005 427/252 |
| 2013/0251903 A1* | 9/2013 | Han | C23C 16/18 427/252 |

(Continued)

FOREIGN PATENT DOCUMENTS

| | | |
|---|---|---|
| KR | 10-2012-0053479 | 5/2012 |
| WO | WO-2012/027357 | 3/2012 |

(Continued)

OTHER PUBLICATIONS

Yempally, Veeranna, et al., "Thermal and Photochemical Reactivity of Maganese Tricarbonyl and Tetracarbonyl Complexes with a Bulky Diazabutadiene Ligand". Inorganic Chemistry, 2014, 53, 4081-4088.*

(Continued)

*Primary Examiner* — Bret Chen
(74) *Attorney, Agent, or Firm* — Servilla Whitney LLC

(57) ABSTRACT

Methods and precursors are provided for deposition of films comprising manganese on surfaces using metal coordination complexes comprising a diazabutadiene-based ligand. Certain methods comprise exposing a substrate surface to a manganese precursor, and exposing the substrate surface to a tertiary amine.

20 Claims, 1 Drawing Sheet

(56) References Cited

U.S. PATENT DOCUMENTS

| | | | | |
|---|---|---|---|---|
| 2014/0242806 A1* | 8/2014 | Knapp | ............... | H01L 21/02175 438/758 |
| 2014/0363971 A1* | 12/2014 | Matsumoto | ............. | C23C 16/40 438/653 |
| 2015/0194384 A1* | 7/2015 | Yu | ..................... | H01L 23/53238 257/751 |
| 2015/0340158 A1* | 11/2015 | Naito | ..................... | H01G 9/052 205/224 |

FOREIGN PATENT DOCUMENTS

| | | |
|---|---|---|
| WO | WO-2012/059881 | 5/2012 |
| WO | WO-2013/046155 | 4/2013 |
| WO | WO-2013/046157 | 4/2013 |

OTHER PUBLICATIONS

Fernandes, Tiago A., et al., "Synthesis and catalytic properties of manganes(II) and oxovanadium(IV) complexes anchored to mesoporous MCM-41". Microporous and Mesoporous Materials 112 (2008) 14-25.*

Knisley, Thomas Joseph, et al., New Precursors and Chemistry for the Growth of Transition Metal Films by Atomic Layer Deposition, *Ph. D. Chemistry Dissertation, Wayne State University Graduate School* 2012, 120 pages.

PCT Internatioal Search Report and Written Opinion in PCT/US2014/041313, mailed Oct. 13, 2014, 14 pages.

* cited by examiner

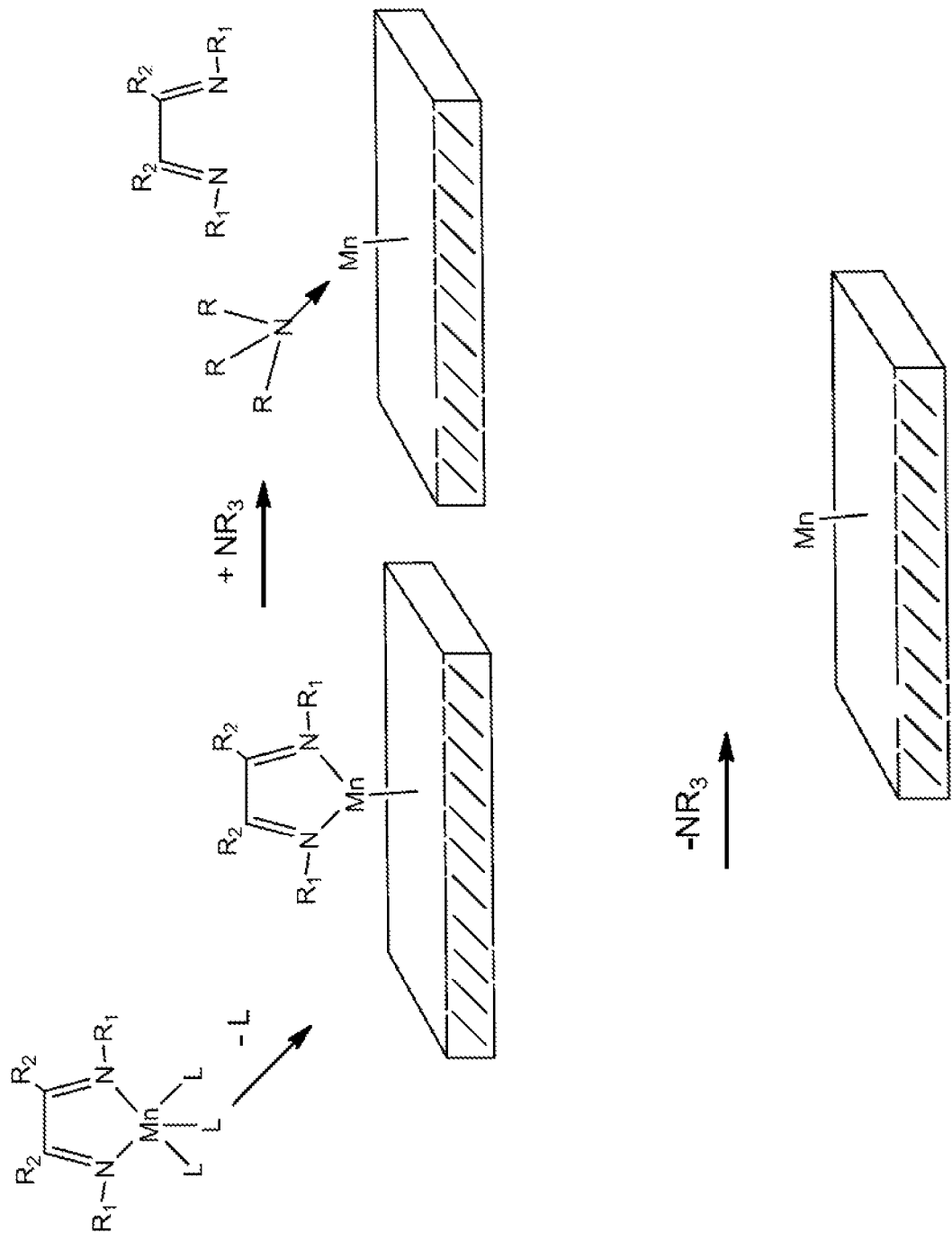

METHODS FOR THE DEPOSITION OF MANGANESE-CONTAINING FILMS USING DIAZABUTADIENE-BASED PRECURSORS

CROSS-REFERENCE TO RELATED APPLICATIONS

This application claims priority to U.S. Provisional No. 61/831,748, filed Jun. 6, 2013, the entire contents of which are herein incorporated by reference.

TECHNICAL FIELD

The present invention relates generally to methods of depositing thin films comprising manganese and to metal coordination complexes useful in such methods. In particular, the invention relates to the use of coordination complexes containing diazabutadiene-based ligands to deposit manganese-containing films.

BACKGROUND

Deposition of thin films on a substrate surface is an ubiquitous process in a variety of industries including semiconductor processing, diffusion barrier coatings and dielectrics for magnetic read/write heads. In the semiconductor industry, in particular, miniaturization seeks atomic level control of thin film deposition to produce conformal coatings on high aspect structures. One method for deposition of thin films with atomic layer control and conformal deposition is atomic layer deposition (ALD), which employs sequential, surface reactions to form layers of precise thickness controlled at the Angstrom or monolayer level. Most ALD processes are based on binary reaction sequences which deposit a binary compound film. Each of the two surface reactions occurs sequentially a thin film can be deposited with a relatively high level of control. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In stage A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In stage B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain a targeted film thickness. Although a few processes have been developed that are effective for deposition of elemental ruthenium and other late transition metals, in general ALD processes for deposition of pure metal have not been sufficiently successful to be adopted commercially. There is a need for new deposition chemistries that are commercially viable, particularly in the area of elemental metal films, including for thin films consisting essentially of manganese. There are known methods of depositing thin manganese metal films via physical deposition methods in back end of the line processes. However, the thin metal films deposited this way have been shown to migrate to $SiO_2$ interfaces. This forms manganese oxide, which acts as a barrier layer and prevents copper diffusion.

There is also a need for chemistries useful in the deposition of films comprising manganese nitride. Tantalum nitride (TaN) is a copper barrier at film thicknesses greater than 10 Å, where the film is continuous. However, because a Ta atom is about 4 Å in diameter, TaN films around 5 Å thick are not continuous. For smaller nodes where thinner TaN is utilized, TaN by itself may be a discontinuous film, thus limiting the copper barrier properties of the TaN. Current methods include a Ta layer over a TaN layer, which acts as a wetting layer for copper and provides the continuity of a barrier film. For smaller nodes (less than 32 nm), however, this method leads to larger line resistance and hence is not an adequate solution. Atomic layer deposition (ALD) TaN is being used as an advanced technology with better conformality; however, the film quality of ALD TaN still needs significant improvements. MnN may be a suitable replacement for TaN, and thus new methods for deposition of MnN are sought.

SUMMARY

One aspect of the invention pertains to a method of depositing a manganese-containing film. In one or more embodiments, the method comprises exposing a substrate surface to a manganese precursor having a structure represented by:

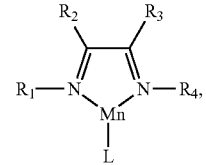

wherein $R_1$-$R_4$ are each independently branched or unbranched, alkyl, allyl, or aryl C1-C6, and L is one or more neutral Lewis base or pi acceptor ligands. The method may also further comprise exposing the substrate surface to a tertiary amine.

Another aspect of the invention also pertains to a method of depositing a manganese-containing film. The method comprises exposing a substrate surface to a manganese precursor having a structure represented by:

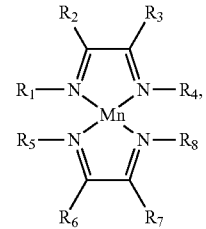

wherein $R_1$-$R_8$ are each independently branched or unbranched, alkyl, allyl, or aryl C1-C6. The method also comprises exposing the substrate surface to a tertiary amine.

Another aspect of the invention also pertains to a method of depositing a manganese-containing film. The method comprises exposing a substrate surface to a manganese precursor having a structure represented by:

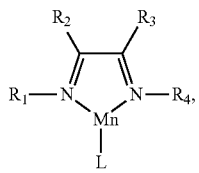

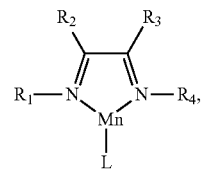

wherein $R_1$-$R_8$ are each independently branched or unbranched, alkyl, allyl, or aryl C1-C6, and L is one or more ligands selected from an amidinate, nitrile, carbonyl and pi-bound alkene/alkyne ligand.

BRIEF DESCRIPTION OF THE DRAWING

The FIGURE is a schematic showing a possible mechanism for deposition of a film consisting essentially of manganese according to one or more embodiments of the invention.

DETAILED DESCRIPTION

Before describing several exemplary embodiments of the invention, it is to be understood that the invention is not limited to the details of construction or process stages set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Embodiments of the invention relate to the production of manganese (Mn) or manganese nitride ($MnN_x$) from an organometallic precursor. The deposition methods can be atomic layer deposition (ALD) or chemical vapor deposition (CVD). The organometallic precursor comprises at least one diazabutadiene-based ligand. There are few examples of CVD/ALD films of high quality and high purity $MnN_x$ or manganese. Some precursors have oxygen containing ligands, which leads to $MnO_x$ formation. Manganese oxides formed on copper surfaces has difficulty to segregate away and will increase the via resistance. Some precursors have extremely low vapor pressure and reaction rate, which poses challenges for chamber design and poor film morphology during ALD deposition. In one or more embodiments, the disclosed processes produce the advantageous effect that high purity manganese film are produced by CVD and high purity manganese nitride films by ALD with smooth morphology.

Embodiments of the present invention also exhibit the advantageous effect and address the need for the deposition of pure Mn by providing novel chemistries which are specifically designed and optimized to take advantage of the atomic layer deposition process.

In one embodiment of the invention, the precursor comprises a metal coordination complex containing a diazabutadiene-based ligand. In one or more embodiments, the metal coordination complex has a structure represented by formula (I):

wherein $R_1$-$R_4$ are each independently branched or unbranched, alkyl, allyl, or aryl C1-C6, and L is one or more neutral Lewis base or pi acceptor ligands.

In one or more embodiments, L may be three separate ligands. In other embodiments, there may be one or two ligands besides the diazabutadiene-based ligand, which are coordinated via more than one coordination bond to the metal center. The coordination of the ligands will depend on the particular ligands chosen. For example, there may be three ligands, in which case the structure could be represented by:

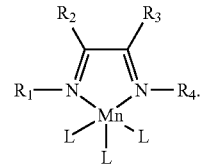

In one or more embodiments, each L is independently a nitrile, carbonyl or pi-bound alkene/alkyne ligand. In some embodiments, each L is the same.

In some embodiments, the coordination complex comprises an amidinate ligand, and has a structure represented by:

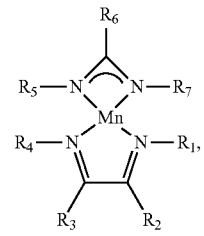

wherein $R_{5-7}$ each independently represent H or $C_{1-6}$ linear, branched or cyclic alkyl or allyl group. In further embodiments, $R_{5-7}$ are each independently represent H or methyl, ethyl, propyl (iso or n) or cyclo hexyl.

The term "metal coordination complex" as used herein is used interchangeably with "metal complex" and "coordination complex," and includes structures that consist of a central metal atom bonded to one or more ligands. As will be discussed in more detail below, the metal complexes according to one or more embodiments of the invention feature a diazabutadiene ligand (also referred to as "diazabutadiene-based," "DAD," and "DAD-based" ligand).

The metal coordination complexes described herein may be synthesized by reacting the DAD ligand with sodium to generate a Na(DAD) complex. This complex can be further reacted with a metal halide to generate the metal(DAD) coordination complex.

Accordingly, one aspect of the invention relates to a method of depositing a manganese-containing film. The method comprising exposing a substrate surface to a manganese precursor having a structure represented by formula (I):

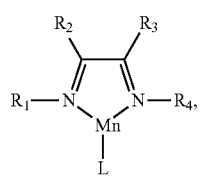

wherein $R_1$-$R_4$ are each independently branched or unbranched, alkyl, allyl, or aryl C1-C6, and L is one or more neutral Lewis base or pi acceptor ligands; and exposing the substrate surface to a tertiary amine.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive bather layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

One or more of the methods described above may be an atomic layer deposition (ALD) process. In such embodiments, the substrate surface is exposed to the tertiary amine and the manganese precursor sequentially or substantially sequentially. As used herein throughout the specification, "substantially sequentially" means that a majority of the duration of the precursor exposure does not overlap with the exposure of the tertiary amine, although there may be some overlap.

One or more of the methods described above may be a chemical vapor deposition (CVD) process. In such embodiments, the substrate surface is exposed to the tertiary amine and the manganese precursor simultaneously or substantially simultaneously. As used herein throughout the specification, "substantially simultaneously" means that the majority of the duration of the precursor exposure overlaps with the exposure to the tertiary amine, although they may not be exactly coextensive.

In one or more embodiments, the deposited film comprises manganese. In particular, the deposited films are considered to be "manganese-rich" in that carbon, nitrogen and halides are present only at relatively low levers. Thus for example, in some embodiments, the manganese film comprises manganese nitride, also referred to as "MnN$_x$." The x of some embodiments has a value of about 0.1 to about 4, or in the range of about 0.2 to about 2, or in the range of about 0.25 to about 1. Where the levels of nitrogen are particularly low, the deposited film may be considered a film consisting essentially of manganese. As used herein, the phrase "film consisting essentially of manganese," is used interchangeably with "elemental manganese" and "pure manganese" films.

While not wishing to be bound to any particular theory, it is thought that the diazabutadiene-based ligand acts as a neutral ligand. When the manganese precursor is reacted with NH$_3$, the NH$_3$ will bind via metathesis to obtain protonated diazabutadiene and a film comprising manganese nitride. In contrast, when the diazabutadiene-based ligand is reacted with a tertiary amine, the tertiary amine takes electron density on the nitrogen. This results in deposition of a manganese-rich. The alkyl groups that are used to replace hydrogen atoms on NH$_3$ are less reactive.

The tertiary amine may be varied, and generally includes any size tertiary amine that has the appropriate volatility to be useful during a film deposition process. In some embodiments, the tertiary amine comprises trimethylamine, triethyleamine, N,N-ethyldimethylamine and N,N-methyldiethylamine.

The precursors and/or reactants may be in a state of gas, plasma, vapor or other state of matter useful for a vapor deposition process. The methods optionally feature a purge. During a purging process, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

The FIGURE illustrates an example according to one or more of the embodiments described herein. As illustrated, a heteroleptic metal coordination complex is vaporized, optionally in a mixture with an inert carrier gas, and flowed in the vapor phase to a substrate within a deposition chamber (not shown). The substrate has a surface that is appropriate for adsorption of the metal coordination complex to the surface via the metal ion when the ligands dissociate from the complex, exposing an active site for bonding with the surface. In one embodiment, the substrate used is a semiconductor wafer. The non-butadiene ligands dissociate due to non-butadiene ligands relatively weak interaction with the Mn metal center, while the diazabutadiene ligand will have the tertiary amine be removed from the metal center. In this example the surface for adsorption may be bare metal. The surface is exposed to the metal coordination complex for sufficient time to permit adsorption of the complex in a layer on the surface. A tertiary amine is then flowed into the deposition chamber to break the bond in the ligand, releasing the diazabutadiene-based ligand from the metal center and leaving an atomic layer of elemental metal on the substrate. In some embodiments, the process also includes purging excess unreacted vapor phase metal complex with an inert gas prior to addition of the tertiary amine. In one or more embodiments, the vapor phase metal complex is in a mixture with an inert gas.

In some embodiments, the precursor may have two diazabutadiene-based ligands. Such a precursor has a structure represented by formula (II):

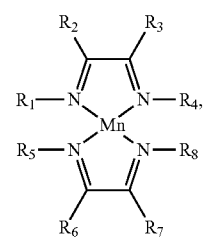

wherein $R_1$-$R_8$ are each independently branched or unbranched, alkyl, allyl, or aryl C1-C6.

Accordingly, another aspect of the invention pertains to a method of depositing a manganese-containing film. The method comprises exposing a substrate surface to a manganese precursor having a structure represented by formula (II), and exposing the substrate surface to a tertiary amine. In some embodiments, the manganese precursor may be homoleptic. In such embodiments, the R substituents on the two ligands will be the same as each other.

In another embodiment, a method of forming manganese metal on a substrate surface comprises: during an atomic layer deposition process, exposing a substrate to a vapor phase metal coordination complex having the formula (I) or (II), such that a layer is formed on the surface comprising the metal coordination complex bound to the surface by the manganese. Subsequently, during an atomic layer deposition process, the method comprises exposing the substrate having bound metal complex with a tertiary amine such that an exchange reaction occurs between the bound metal coordination complex and the reducing gas, resulting in dissociating the bound metal complex and producing a first layer of elemental manganese on the surface of the substrate. The atomic layer deposition process may be sequentially repeated.

The reaction time, temperature and pressure are selected to create a metal-surface interaction and achieve a layer on the surface of the substrate. The reaction conditions for the ALD reaction will be selected based on the properties of the metal coordination complex. The deposition can be carried out at atmospheric pressure but is more commonly carried out at a reduced pressure. The vapor pressure of the metal coordination complex should be low enough to be practical in such applications. The substrate temperature should be high enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on the specific metal coordination complex used and the pressure. The properties of a specific metal coordination complex for use in the ALD deposition methods of the invention can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

An optimized metal coordination complex for use in the deposition methods of the invention will meet the needs for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

The substrate for deposition of the elemental thin layer films may be any substrate suitable for conformal film coating in an ALD or CVD process. Such substrates include silicon, silica or coated silicon, metal, metal oxide and metal nitride. In one aspect of the invention, the substrate is a semiconductor substrate.

In one or more of the methods described herein, additional repetitions of the deposition cycle may be used to build a layer of elemental metal of a targeted thickness. That is, optionally, a second atomic layer of elemental metal may be formed added on the first atomic layer by repeating the process of the reaction cycle. Tertiary amine remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and tertiary amine on the metal of the first atomic layer. This displaces one of the ligands from the vapor phase metal coordination complex and leaves the metal atom of the metal coordination complex bound to the metal atom of the first atomic layer. The reaction time, temperature and pressure are selected to create a metal-surface interaction and form a layer on the surface of the substrate. Unreacted vapor phase metal coordination complex and released ligand are purged from the deposition chamber using an insert gas. A tertiary amine is flowed into the deposition chamber to break the bond(s) between the metal and any remaining ligand(s), releasing the remaining ligand(s) from the metal center and producing a second atomic layer of elemental metal on the first atomic layer of manganese-containing film.

In one embodiment, a second layer of manganese may be added by contacting the first layer of elemental manganese on the substrate surface with a vapor phrase metal coordination complex such that an exchange reaction occurs between the metal complex and the first layer of elemental metal, resulting in partially dissociating the metal complex and producing a second layer on the surface comprising the partially dissociated metal complex bound to the first elemental manganese layer by manganese; and contacting the bound metal complex of the second layer with a tertiary amine such that an exchange reaction occurs between the bound metal complex and the reducing gas, resulting in dissociating the bound metal complex and producing a second layer of manganese-containing film on the surface of the substrate.

As embodiments of the invention provide a method for depositing or forming manganese-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, plasmas may not be used as well.

In some embodiments, the manganese containing film is continuous at a thickness less than about 2 nm As used in this specification and the appended claims, the term "continuous" means that there are no gaps in the film greater than about 10% of the total film area. In some embodiments, the film is continuous at a thickness less than 3 nm, 2.5 nm, 1.5 nm, 1 nm or 0.5 nm.

The deposited manganese or $MnN_x$ film can be used as an alternative diffusion barrier in the back-end-of-line copper interconnections to replace currently used PVD TaN or ALD TaN. The deposition approach can be integrated with the ALD TaN deposition to generate manganese doped TaN or tantalum doped with $MnN_x$. Manganese or $MnN_x$ are new materials being proposed for these applications. Manganese can react with dielectric underlayers to form manganese silicates as the barrier. Without being bound to any particular theory of operation, it is believed that the $MnN_x$ is not only the diffusion barrier but also promotes the adhesion between copper and the dielectrics. Therefore, in some embodiments, the methods further comprise depositing copper over the manganese-containing film.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to a targeted separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific stages of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet stages. For example, a substrate may be rotated throughout the entire process, or the substrate can be rotated by a small amount between exposure to different reactive or purge gases. Rotating the substrate during processing (either continuously or in stages) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and equivalents.

What is claimed is:

1. A method of depositing a manganese-containing film, the method comprising exposing a substrate surface to a manganese precursor having a structure represented by:

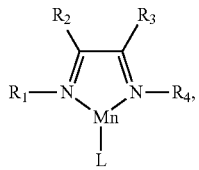

wherein $R_1$-$R_4$ are each independently branched or unbranched, alkyl, allyl, or aryl C1-C6, and L is one or more neutral Lewis base or pi acceptor ligands; and
exposing the substrate surface to a tertiary amine.

2. The method of claim 1, wherein L is selected from a nitrile, carbonyl and pi-bound alkene/alkyne ligand.

3. The method of claim 1, wherein L represents three separate ligands, which are the same.

4. The method of claim 1, wherein the substrate surface is exposed to the tertiary amine and the manganese precursor simultaneously or substantially simultaneously.

5. The method of claim 1, wherein the substrate surface is exposed to the tertiary amine and the manganese precursor sequentially or substantially sequentially.

6. The method of claim 1, wherein the tertiary amine comprises trimethylamine, triethyleamine, N,N-ethyldimethylamine and N,N-methyldiethylamine.

7. The method of claim 1, wherein the precursor has a structure represented by:

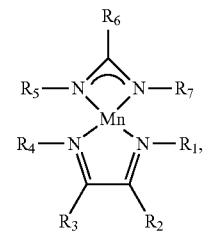

wherein $R_{5-7}$ each independently represent H or $C_{1-6}$ linear, branched or cyclic alkyl or allyl group.

8. The method of claim 1, wherein the method results in deposition of a film comprising manganese nitride.

9. The method of claim 8, wherein the film comprising manganese nitride has a formula represented by $MnN_x$, wherein x has a value of about 0.1 to about 4.

10. The method of claim 1, further comprising repeating exposure of the substrate surface to the manganese precursor and tertiary amine.

11. The method of claim 1, wherein the manganese precursor is homoleptic.

12. A method of depositing a manganese-containing film, the method comprising:
exposing a substrate surface to a manganese precursor having a structure represented by:

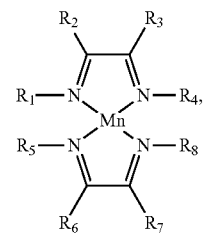

wherein $R_1$-$R_8$ are each independently branched or unbranched, alkyl, allyl, or aryl C1-C6; and
exposing the substrate surface to a tertiary amine.

13. The method of claim 12, wherein the manganese precursor is homoleptic.

14. The method of claim 12, wherein the substrate surface is exposed to the tertiary amine and the manganese precursor simultaneously or substantially simultaneously.

15. The method of claim 12, wherein the substrate surface is exposed to the tertiary amine and the manganese precursor sequentially or substantially sequentially.

16. The method of claim 12, wherein the tertiary amine comprises trimethylamine, triethyleamine, N,N-ethyldimethylamine and N,N-methyldiethylamine.

17. The method of claim 12, wherein a film comprising manganese nitride is deposited.

18. The method of claim 17, wherein the film comprising manganese nitride has a formula represented by $MnN_x$, wherein x has a value of about 0.1 to about 4.

19. The method of claim 12, further comprising repeating exposure of the substrate surface to the manganese precursor and tertiary amine.

20. A method of depositing a manganese-containing film, the method comprising:

exposing a substrate surface to a manganese precursor having a structure represented by:
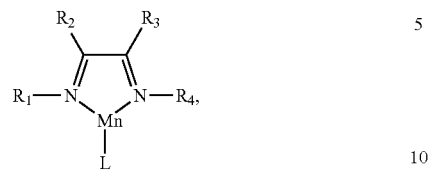
wherein $R_1$-$R_4$ are each independently branched or unbranched, alkyl, allyl, or aryl C1-C6, and L is one or more ligands selected from an amidinate, nitrile, carbonyl and pi-bound alkene/alkyne ligand; and
exposing the substrate surface to a tertiary amine.
* * * * *